United States Patent [19]
Kikinis

[11] Patent Number: 5,473,506
[45] Date of Patent: Dec. 5, 1995

[54] COOLING A LARGE MICROPROCESSOR IN A SMALL MODULE

[75] Inventor: Dan Kikinis, Saratoga, Calif.

[73] Assignee: Elonex Technologies, Inc., Sunnyvale, Calif.

[21] Appl. No.: 152,431

[22] Filed: Nov. 12, 1993

[51] Int. Cl.[6] ...................................................... H05K 7/20
[52] U.S. Cl. ............................................ 361/688; 361/704
[58] Field of Search ......................... 174/16.3; 165/80.3, 165/185; 257/718–719, 726–727; 361/687–690, 704, 707–711, 720, 725, 727

[56] References Cited

U.S. PATENT DOCUMENTS

| | | | |
|---|---|---|---|
| 4,825,337 | 4/1989 | Karpman | 361/711 |
| 5,313,362 | 5/1994 | Hatada et al. | 361/709 |

Primary Examiner—Gregory D. Thompson
Attorney, Agent, or Firm—Donald R. Boys

[57] ABSTRACT

A modular computer with docking bays for receiving functional modules and connecting the functional modules to internal computer circuitry has translatable heat-sink structures for contacting docked functional modules to extract waste heat generated by operation of the functional modules. The structures are mechanically actuated to retract to provide clearance for insertion and withdrawal of functional modules, and to advance to contact modules when docked. Heat-sink structures are shaped in some embodiments to securely retain docked modules, and in some instances, the translation of the heat-sink structures is by electrically operable actuators, which may be actuated by signals from a CPU of the modular computer. In these instances, the computer may be configured to require a security code or special input sequence to retract the heat-sink structures allowing a module to be removed.

15 Claims, 3 Drawing Sheets

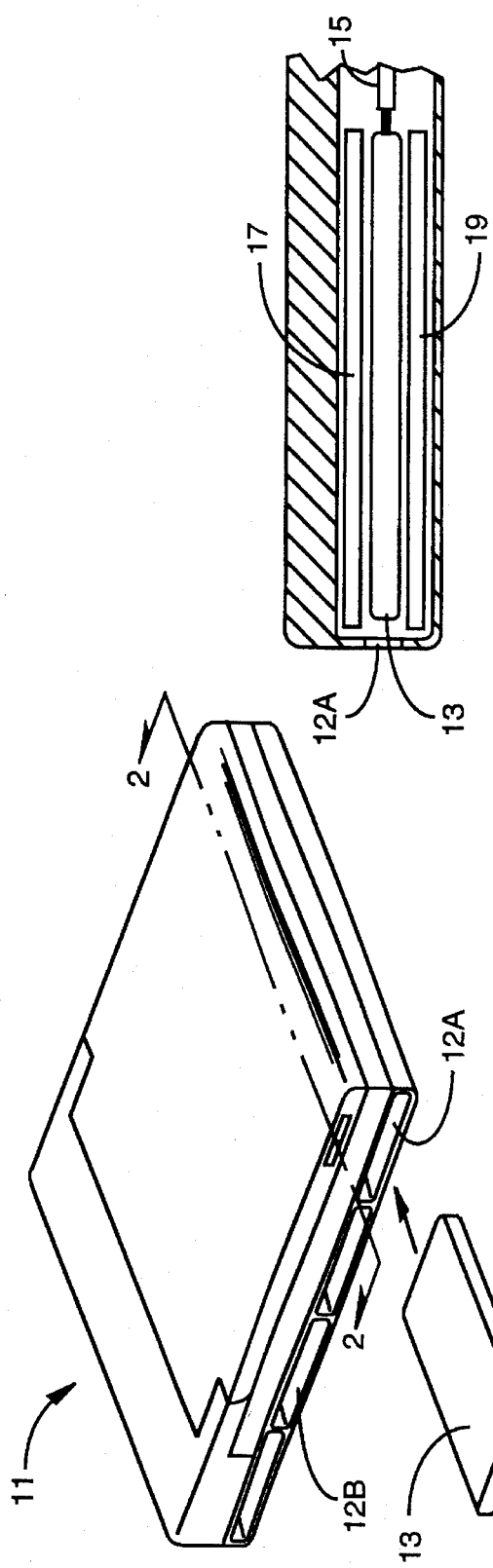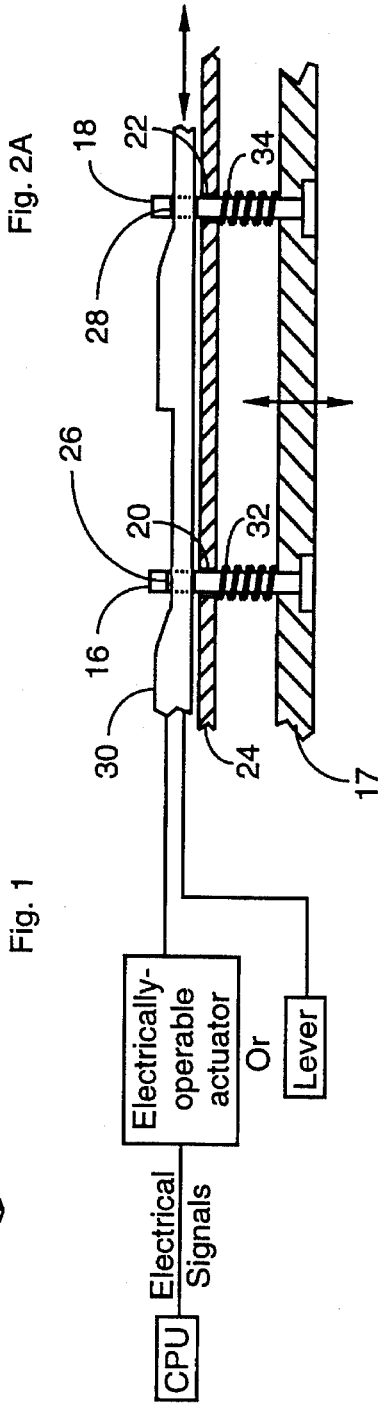

COOLING A LARGE MICROPROCESSOR IN A SMALL MODULE

FIELD OF THE INVENTION

This invention is in the area of portable computers, and pertains more specifically to apparatus and methods for using large microprocessors in small portable computers.

BACKGROUND OF THE INVENTION

Portable computers such as notebooks and palmtops are popular among computer users who travel and need to take their work along. They are smaller and lighter than laptops, and are therefore more portable. It is currently possible to build very small computers, and to provide a great deal of modularity and therefore flexibility in the application of such machines.

It is known to the inventors, for example, to build a palmtop or notebook computer wherein various modules are inserted into bays and make connection therein to a bus structure. In such modular portable computers the modules provide divisible electronic functions. Taken to the extreme, nearly every independent function may be incorporated into a module as a peripheral. In a modular computer of this sort, the framework without the modules may comprise essentially a bus structure and a power conversion unit. Functional modules may include interchangeable CPUs, memory devices of various sorts, system control logic, peripheral communication devices, I/O devices, and more. Also, modules may assume a wide variety of shapes and sizes, such as the well-known Personal Computer Memory Card International Association (PCMCIA) form factor standards.

The modular concept gives the user a choice of functional configurations in one portable computer. For example, while traveling a user may require a modem but not a floppy disk drive, and the modular concept lets the user select the functions he/she needs. The modular concept also allows a portable computer to be smaller and more portable than it would be if all the functions that might be needed have to be incorporated. Size is a very competitive criterion in commanding market share. The evolution to smaller and lighter modular computers, however, is not without problems.

One of the problems in such a modular computer is dissipating heat from the individual modules. Incorporation of a CPU module into portable computer architecture is very desirable, because it provides ability to tailor the CPU power to other modules and software applications. It also allows a computer owner to upgrade to more powerful CPUs as they become available. However, incorporating a large microprocessor in a module configured for a modular portable computer creates a significant concentration of heat to dissipate.

Heat generation by large microprocessors in functional modules is so great that a prudent approach to packaging is imperative. Also, the conventional approaches of cooling fans and the like are solutions that pose an additional burden in the design of portable computers, requiring more space and larger power supplies. In addition, high running temperature degrades computer performance and can lead to failure. Manufacturers that do not address thermal implications that directly affect CPU performance risk premature microprocessor failures. An overheated CPU can cause various problems, ranging from data corruption to the loss of file-allocation tables to the microprocessor shutting itself down.

It is likely that future trends in development will result in faster, hotter microprocessors, which will require ever more efficient ways to transfer heat to the surroundings. As one example, Intel's new Pentium™, scheduled to succeed the 486 family of microprocessors, has about 3 million transistors, producing heat at a high rate, which, if not disposed of properly, can limit chip performance. It is estimated the Pentium CPU will generate as much as 16 watts during operation.

Intel has established a certification procedure with microcomputer manufacturers to qualify general-purpose computers for safe Pentium use, and few manufacturers have enough cooling for full certification. And the contemplated use of these devices in functional modules and other electronic devices for use in portable computers will require extraordinary efforts to remove waste heat.

The present invention addresses the above-described problems particularly pertaining to use of high-performance microprocessors in modular, portable general-purpose computers. What is needed is a method of removing CPU-generated waste heat economically and effectively within the small confines of a modular, portable computer, guaranteeing optimal processing performance, longevity and reliability.

SUMMARY OF THE INVENTION

In an embodiment of the present invention, a computer having a docking bay for receiving a functional module has a module cooling system comprising a heat-sink structure within the docking bay for contacting and cooling a functional module in docked position, and a translation means for moving the heat-sink structure against a module in docked position to accomplish heat absorption from the module. In various embodiments, heat-sink structures have a flexible, heat-conductive interface for conforming intimately to modules, and special shapes to securely retain docked modules. In embodiments with electrically operable actuators, the computer may be configured to require a special input sequence or other security code to release a module for removal from a docking bay.

Cooling apparatus and methods according to embodiments of the present invention provide for efficiently removing heat from functional modules configured to be added to a compatible computer structure. By providing efficient cooling, full operating potential of modules, particularly modules having high-performance microprocessors, may be ensured.

BRIEF DESCRIPTION OF THE DRAWINGS

FIG. 1 is an isometric view of a modular, portable general-purpose computer, showing a function module in position for docking.

FIG. 2A is a cross-sectional view along line 2—2 of FIG. 1 showing one module docking bay in a modular computer having disengaged cooling elements according to an embodiment of the invention.

FIG. 2B is a side elevation view of a portion of one cooling structure, guided on vertical guide pins with extension springs, and operated by a movable cam bar.

DESCRIPTION OF THE PREFERRED EMBODIMENTS

Figure 3:
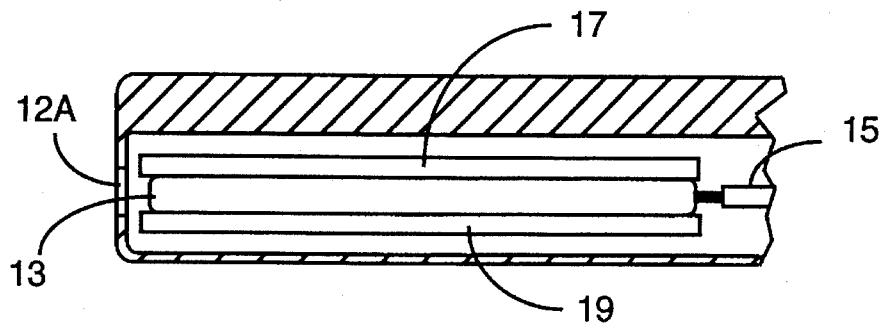
FIG. 3 is another cross-sectional view along line 2—2 on FIG. 1 showing the cooling elements engaged.

FIG. 1 is an isometric view of a portable general-purpose computer framework 11 according to an embodiment of the present invention. There are, along two sides of framework 11, a series of docking bays such as bays 12A and 12B configured to receive function modules 13. The modules are configured to provide functional characteristics for the computer system as described above. More particularly, modules are expected to be used comprising microprocessors and the like that generate considerable waste heat. A representative functional module 13 is shown in position to be inserted in bay 12A.

FIG. 2A is a cross-sectional view of docking bay 12A in the direction of arrows 2—2 of FIG. 1, showing function module 13 inserted into docking bay 12A, engaging a connector 15 which provides electrical connection to an internal bus structure. Cooling structures 17 and 19 shown above and below module 13 are, in this embodiment, heat absorbent and conductive plates made of highly heat-conductive and heat absorbent material, such as copper. Cooling structures 17 and 19 are spaced apart from the inserted position of a module by a distance above and below the line of insertion and withdrawal, such that they do not interfere with inserting or withdrawing of a module.

The placement and size of cooling structures 17 and 19 may vary widely, depending on configuration of the system, including the dimensions of modules accommodate in the docking bays. Also, although two opposing cooling structures 17 and 19 are shown in this embodiment, in other embodiments there may be only one, either above or below the docking position of a module in the docking bay.

To actively cool a module in a docking bay, the cooling structures must be brought into intimate contact with the module. There are a number of equivalent ways this may be done.

FIG. 2B is a side elevation view of a portion of one cooling structure 17 in an embodiment of the invention, wherein structure 17 is guided on three or more vertical guide pins. Two guide pins 16 and 18 are shown, in this case fastened through and to structure 17. Fastening may be by soldering, welding, screw threads, or by other conventional means.

Pins 16 and 18 in this embodiment pass through guide bores 20 and 22 in an upper wall structure 24 of the particular docking bay, and extend into an enclosure above wall 24. Extension springs 32 and 34 are placed in assembly to urge structure 17 away from wall 24 (toward the position of a functional module docked in the docking bay).

Each of pins 16 and 18, and others not shown, have a longitudinal slot, such as slots 26 and 28, for passage of a cam bar 30. Cam bar 30 is translatable at right angles to pins 16 and 18, and is shaped with risers and plateaus, as is known in the mechanical arts, to retract and extend pins 16 and 18, and therefore structure 17.

Cam bar 30 may be activated (translated) in a number of different ways. In the embodiment shown, cam bars in each module bay are connected to a slide lever (not shown) configured on an edge of the external case of the modular computer. Once functional modules are in place, a user may activate the external lever to engage the cooling structures. In the case of cooling structures both above and below the position of a functional module in a bay, there may be additional cam bars and guide pin structures for the lower structures as well as for the upper structures.

It will be apparent to those with skill in the art that there are many other mechanical systems useful to move cooling structures in the manner required to engage docked function modules. Rotary cams may be used, for example, instead of the cam bars described, and there are many ways external levers, slides, and the like may be implemented to actuate the cam devices and engage the cooling structures. The mechanisms described herein are exemplary.

In another embodiment, activation of the cooling structures may be accomplished by a mechanism moved in the last portion of the translation of a module into a module bay. Such mechanisms are well known in the art. In this case a user-operable linkage is made available to disengage cooling structures 17 and 19 so modules may be removed.

Cooling structures 17 and 19 are activated in some embodiments by electrically operable actuators, such as solenoids, motors, and the like, to close automatically on insertion of a function module. This activation configuration is particularly useful for maximum security. In these embodiments control routines operable on the modular computer cause the actuators to operate. The control routines in some embodiments require a user to enter a code at the keyboard or other input to operate the actuators to engage and disengage. In other embodiments actuation is accomplished by the system BIOS as a part of startup procedures.

Control routines may also include password protection as a means of security. In yet another embodiment, actuators are signalled by control routines available via a CPU function module after insertion. In this case, the CPU function module is first inserted and powered-up through established bus protocols. Machine control routines that control cooling structure engagement then initiate the modular computer's mechanized framework.

It will be apparent to those with skill in the art that there are a wide variety of ways that control routines may be implemented to provide actuation of mechanisms for moving cooling structures to engage function modules.

FIG. 3 is an elevation view similar to FIG. 2, showing cooling structures 17 and 19 engaged, urged against functional module 13. The support and engagement mechanisms are not shown in FIG. 3. In this intimate engagement, waste heat generated by module 13 may be readily absorbed by cooling structures 17 and 19.

It is preferred that the cooling structure or structures urged against a functional module be configured to aid in retaining the module in position in the docking bay. Besides providing a means of retaining modules against accidental displacement, structures configured for retention may also provide security for expensive modules.

Figure 4:
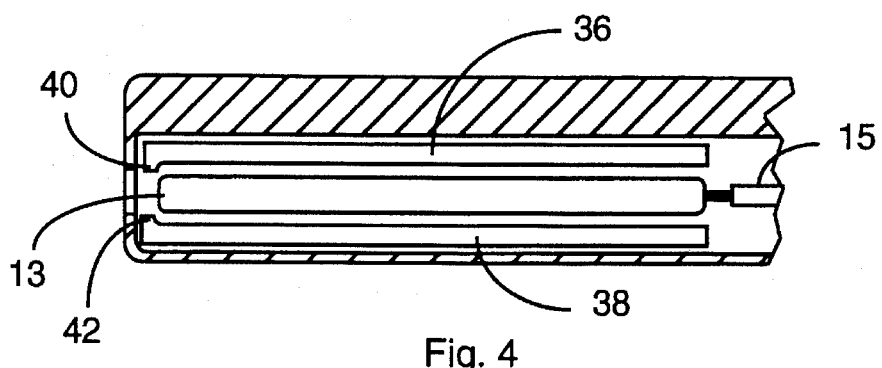
FIG. 4 is a cross-sectional view similar to FIG. 2 showing cooling elements with locking means incorporated into the elements.

FIG. 4 is a side view similar to FIG. 2 showing cooling structures 36 and 38 having extensions 40 and 42 respectively configured to retain a function module when the function modules are engaged. In the disengaged position shown in FIG. 4, cooling structures 36 and 38 are capable of being disengaged (retracted) a sufficient amount that extensions 40 and 42 do not interfere with docking procedures.

Figure 5:
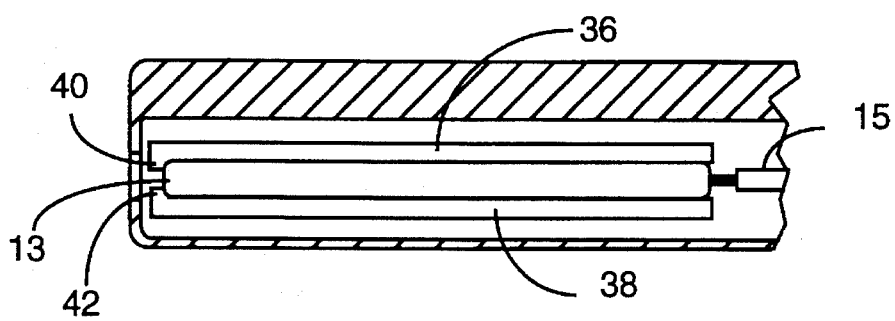
FIG. 5 is a cross-sectional similar to FIG. 4 showing the cooling elements engaged.

FIG. 5 is similar to FIG. 4, except cooling structures 36 and 38 are extended to engage function module 13, such that extensions 40 and 42 prevent the function module from being withdrawn while the cooling structures are engaged. Extensions 40 and 42 may be configured to move a function module to a final position fully engaging connector 15.

In the embodiments described above the cooling structures are heat sinks fashioned as plates of heat absorbing and conducting material. In another embodiment the cooling structures are Peltier devices. They may take other forms as well. The size and design of heat sinks may differ in specific docking bays to accommodate particular modules, which will vary in waste heat production according to the function of the module. CPU modules, for example, are expected to be the worst offenders in generating waste heat. In many cases a modular computer will need no more than one cooled docking bay, that bay reserved for the CPU module.

Figure 6:
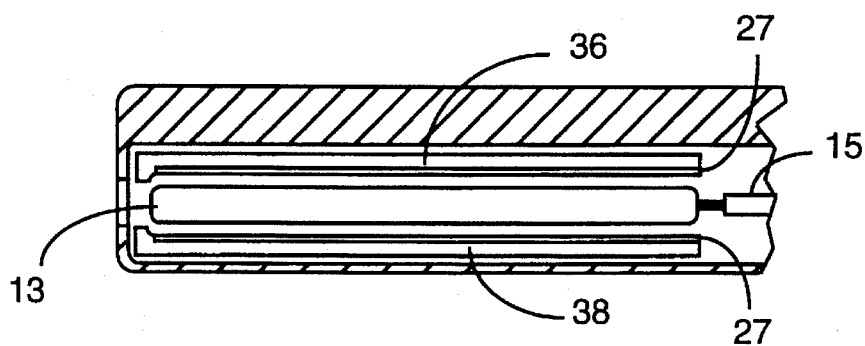
FIG. 6 is a cross-sectional view similar to FIG. 5 showing opposing cooling elements with locking means, each having a layer of compressible heat-conducting material facing the module.

FIG. 6 shows cooling structures 36 and 38 having a layer of compressible heat-conducting material 27 such as Chomerics (TM) aluminum oxide-filled rubber or flexible polymer. In this aspect of the invention a pad of such material is mounted by a heat-resisting adhesive to each cooling structure. In this aspect of the invention, the heat-conducting layered material compresses against the inserted function module. A more continuous thermal contact is made ensuring efficient heat conduction across the interface between the function module and the cooling structure. In an alternative embodiment, the compressive material may be affixed to the corresponding sides of the computer module.

Figure 7:
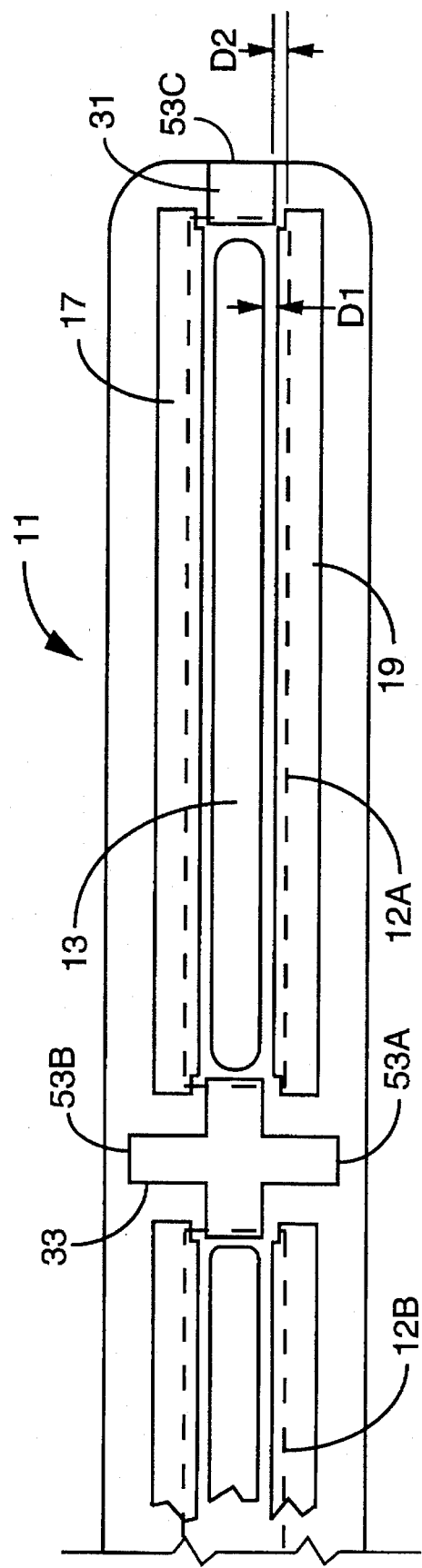
FIG. 7 is a cross-sectional view immediately inside two adjacent bays in a plane parallel to the openings of the bays in the embodiments described.

FIG. 7 is a cross-sectional view immediately inside two adjacent bays 12A and 12B in FIG. 1 in a plane parallel to the openings of the bays. Module bay opening 12A is an end bay while 12B is an interior bay. Module 13 is shown in some intermediate stage of insertion. Cooling structures 17 and 19 are shown in the full open or some intermediate stage of closing. In this aspect of the embodiment, cooling structures 17 and 19 close to secure function module 13 and to contact an interconnected bus system of additional thermal-conducting structures 33 and 31. The distances D1 and D2 are approximately equal, making a thermal loop between occupied docking bays and other internal conducting structures when opposing cooling structures close.

Within all regions of common contact between the moving and stationary heat sinks the mating surfaces are covered in this embodiment with a compressible heat-conducting material to ensure continuous thermal contact between adjacent surfaces. Conducting structure 31 is exposed to the outside air and may be a structural part of the portable computer's case. Conducting structure 31 may ring the entire outside perimeter of the case and may also interconnect to the interior heat-sink bus shown as conducting structure 33. The interior heat-sink bus in this embodiment is an integral part of the supporting framework of the portable computer.

Surfaces 53A, 53B, and 53C may be shaped to maximize heat transfer to the outside air via radiation and convection, such as by grooves or fins. In another embodiment, the heat-sink bus or any individual heat-conducting structure may be connected via a heat conduction interface to an outside heat transferring device, apparatus or structure. For example, at any point along surfaces 53A, 53B and 53C a larger heat sink may be attached in a way to further conduct heat away from the interior of the computer.

It will be apparent to one skilled in the art that there are a relatively large number of changes that can be made in the embodiments described without departing from the spirit and scope of the present invention. Some of these alternatives have already been described, such as the incorporation of an interconnecting heat-sink bus system, and the many ways that actuating mechanisms may be configured. There are similarly many dimensional changes and variations in materials that may be incorporated within the spirit ad scope of the invention.

What is claimed is:

1. A cooling system adapted to be used in a computer having a CPU, an external case, and a docking bay with a window for receiving a functional module in a first direction, comprising:

a heat-sink structure adapted to be mounted within the docking bay for contacting and cooling a functional module in docked position; and translation apparatus connected to the heat-sink structure for moving the heat-sink structure against a module in docked position to accomplish heat absorption from the module;

wherein the translation apparatus moves the heat-sink structure in a second direction substantially orthogonal to the first direction.

2. A module cooling system as in claim 1 wherein the heat-sink structure is a substantially flat metal cooling plate.

3. A module cooling system as in claim 1 further comprising a layer of flexible, heat-conducting material affixed to the heat-sink structure for providing a conformal interface between the heat sink structure and a docked functional module.

4. A module cooling system as in claim 1 wherein the translation apparatus further comprises a lever external to the computer case, the lever operable by a user to operate the translation apparatus.

5. A module cooling system as in claim 1 wherein the translation apparatus is operated by an electrically operable actuator, such as a solenoid.

6. A module cooling system as in claim 5 wherein the electrically operable actuator is controlled by electrical signals initiated by the CPU.

7. A computer system comprising:

an external case;

a CPU connected to an internal communication bus;

a docking bay comprising a window in the case for inserting a functional module in a first direction, and a connector to the internal communication bus for engaging an electrical connector of the functional module;

a heat-sink structure within the docking bay movable to a position to contact any functional module docked; and translation apparatus attached to the heat-sink structure for moving the heat-sink structure against a module in docked position to accomplish heat absorption from the module;

wherein the translation apparatus moves the heat-sink structure in a second direction substantially orthogonal to the first direction.

8. A computer system as in claim 7 wherein the heat-sink structure is a substantially flat metal cooling plate.

9. A computer system as in claim 7 further comprising a layer of flexible, heat-conducting material affixed to the heat-sink structure for providing a conformal interface between the heat-sink structure and a functional module.

10. A computer system as in claim 7 wherein the translation apparatus further comprises a lever external to the computer case, the lever operable by a user to operate the translation apparatus.

11. A computer system as in claim 7 wherein the translation apparatus is operated by an electrically operable actuator, such as a solenoid.

12. A computer system as in claim 11 wherein the electrically operable actuator is controlled by electrical signals initiated by the CPU.

13. A computer system as in claim 12 wherein the translation apparatus is operable by the CPU to withdraw the heat-sink structure from the docked module in a direction opposite to the second direction, and withdrawal requires a preprogrammed security code entered by a user.

14. A computer system as in claim 7 wherein the heat-sink structure comprises an extension for engaging an element of a docked module in docked position in the docking bay with the heat-sink structure in contact with the docked module, engagement of the extension blocking removal of the docked module from the docking bay.

15. A module cooling system as in claim 1 wherein the heat-sink structure comprises an extension for engaging an element of a docked functional module in docked position in the docking bay with the heat-sink structure in contact with the docked module, engagement of the extension blocking removal of the docked module from the docking bay.

* * * * *